(12) United States Patent
Pietambaram et al.

(10) Patent No.: US 11,107,781 B2
(45) Date of Patent: Aug. 31, 2021

(54) RFIC HAVING COAXIAL INTERCONNECT AND MOLDED LAYER

(71) Applicant: Intel Corporation, Santa Clara, CA (US)

(72) Inventors: Srinivas V. Pietambaram, Gilbert, AZ (US); Rahul N. Manepalli, Chandler, AZ (US); Kristof Kuwawi Darmawikarta, Chandler, AZ (US); Robert Alan May, Chandler, AZ (US); Aleksandar Aleksov, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 16/481,392

(22) PCT Filed: Mar. 30, 2017

(86) PCT No.: PCT/US2017/025200
§ 371 (c)(1),
(2) Date: Jul. 26, 2019

(87) PCT Pub. No.: WO2018/182653
PCT Pub. Date: Oct. 4, 2018

(65) Prior Publication Data
US 2019/0393172 A1    Dec. 26, 2019

(51) Int. Cl.
*H01L 23/66*  (2006.01)
*H01L 21/56*  (2006.01)
*H01L 23/00*  (2006.01)

(52) U.S. Cl.
CPC .......... *H01L 23/66* (2013.01); *H01L 21/568* (2013.01); *H01L 24/19* (2013.01);
(Continued)

(58) Field of Classification Search
CPC ..... H01L 2223/6677; H01L 2924/3511; H01L 24/19
See application file for complete search history.

(56) References Cited

U.S. PATENT DOCUMENTS

| 8,455,954 B2 | 6/2013 | Suzuki et al. |
| 9,496,219 B2 | 11/2016 | Yoo et al. |

(Continued)

FOREIGN PATENT DOCUMENTS

| JP | 2006-285958 | 10/2006 |
| KR | 10-2013-0005811 | 1/2013 |

OTHER PUBLICATIONS

International Search Report and Written Opinion for International Patent Application No. PCT/US2017/025200 dated Dec. 27, 2017, 9 pgs.

(Continued)

*Primary Examiner* — Fernando L Toledo
*Assistant Examiner* — Valerie N Newton
(74) *Attorney, Agent, or Firm* — Schwabe, Williamson & Wyatt, P.C.

(57) ABSTRACT

Semiconductor packages having a die electrically connected to an antenna by a coaxial interconnect are described. In an example, a semiconductor package includes a molded layer between a first antenna patch and a second antenna patch of the antenna. The first patch may be electrically connected to the coaxial interconnect, and the second patch may be mounted on the molded layer. The molded layer may be formed from a molding compound, and may have a stiffness to resist warpage during fabrication and use of the semiconductor package.

20 Claims, 12 Drawing Sheets

(52) U.S. Cl.
CPC .............. *H01L 2223/6677* (2013.01); *H01L 2924/15174* (2013.01); *H01L 2924/18162* (2013.01); *H01L 2924/3025* (2013.01); *H01L 2924/3511* (2013.01)

(56) References Cited

U.S. PATENT DOCUMENTS

| | | |
|---|---|---|
| 2014/0168014 A1 | 6/2014 | Chih et al. |
| 2014/0198013 A1 | 7/2014 | Saraswat et al. |
| 2015/0003000 A1* | 1/2015 | Manepalli ............... H01L 23/50 |
| | | 361/679.32 |
| 2015/0084194 A1* | 3/2015 | Molzer ................. H01L 23/481 |
| | | 257/741 |
| 2017/0084591 A1 | 3/2017 | Magnus |
| 2018/0005957 A1* | 1/2018 | Vincent ............. H01L 23/49838 |

OTHER PUBLICATIONS

International Preliminary Report on Patentability for International Patent Application No. PCT/US2017/025200, dated Oct. 10, 2019, 6 pages.

\* cited by examiner

RFIC HAVING COAXIAL INTERCONNECT AND MOLDED LAYER

CROSS-REFERENCE TO RELATED APPLICATION

This patent application is a U.S. National Phase Application under 35 U.S.C. § 371 of International Application No. PCT/US2017/025200, filed Mar. 30, 2017, entitled "RFIC HAVING COAXIAL INTERCONNECT AND MOLDED LAYER," which designates the United States of America, the entire disclosure of which is hereby incorporated by reference in its entirety and for all purposes.

FIELD OF THE INVENTION

Embodiments are in the field of integrated circuit packages and, in particular, radio frequency integrated circuits having integrated antennas.

BACKGROUND OF THE INVENTION

Wireless communications are currently at a fourth generation (4G) standard. New applications, such as Internet-of-Things (IoT) applications, autonomous cars, virtual reality (VR) devices, and high definition video streaming to mobile devices, however, will require higher bandwidth and faster speeds than current wireless communications technology can provide. Accordingly, a shift is underway from the 4G standard to a fifth generation (5G) standard. The shift may entail innovations in advanced communication chips that having higher bandwidth, faster speed, higher frequency, and lower latency than current 4G communication chips.

DETAILED DESCRIPTION OF THE INVENTION

Semiconductor packages having a die electrically connected to an antenna by a coaxial interconnect are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Figure 1A:
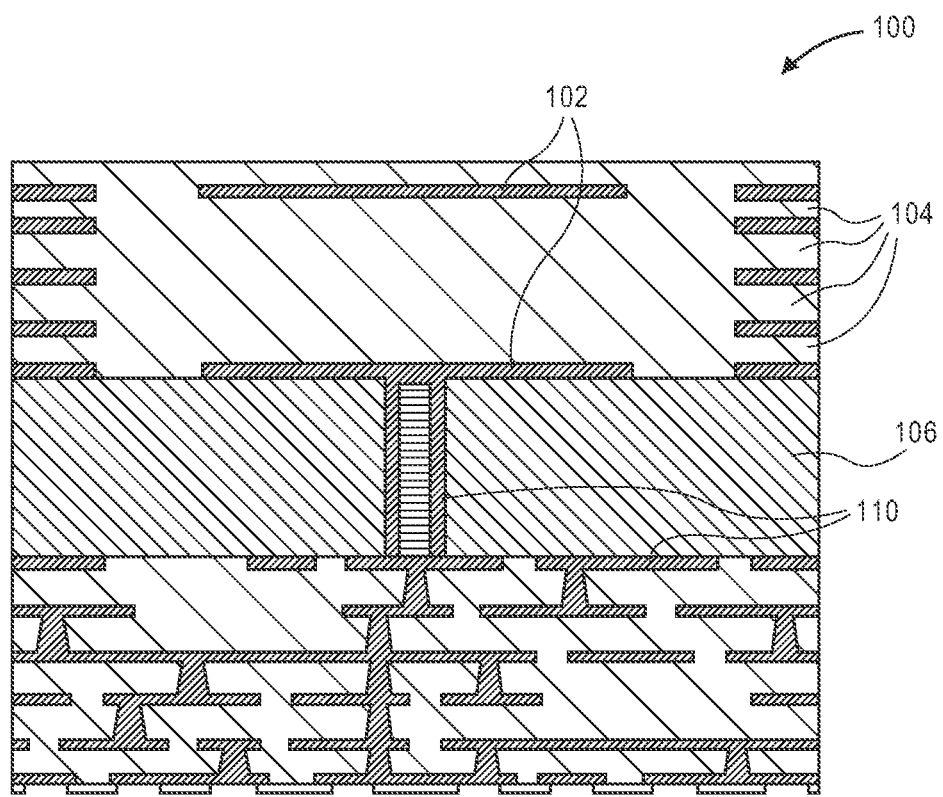
FIGS. 1A-1B illustrate sectional views of a semiconductor package having an integrated antenna array.
Figure 1B:
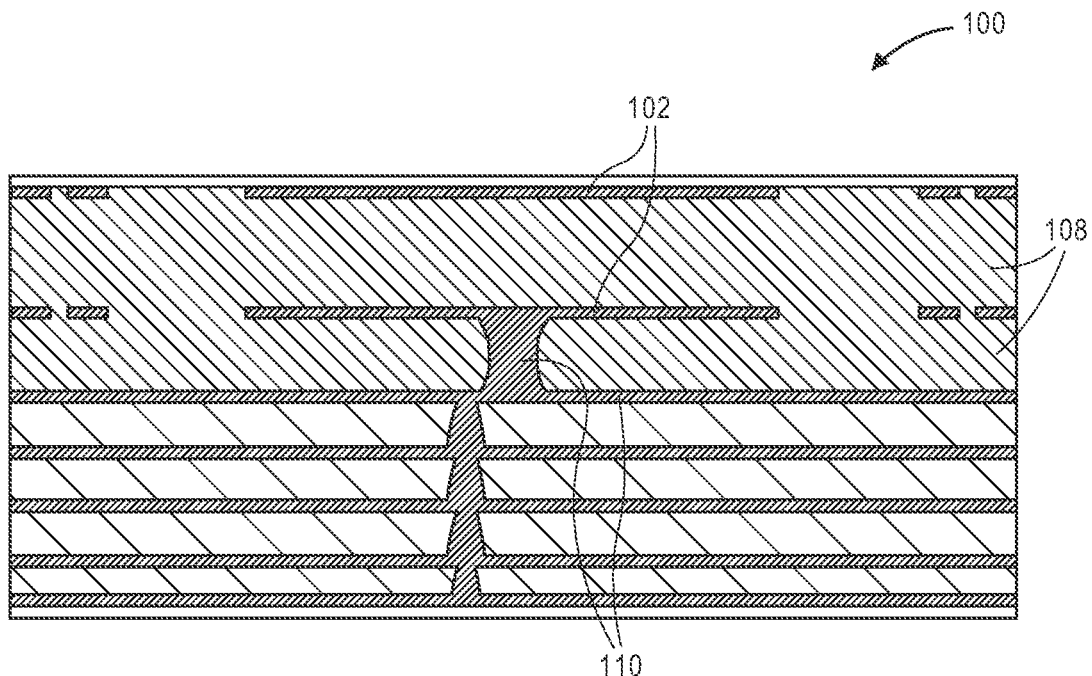

The shift from the 4G standard to the 5G standard of wireless communications may require innovations in semiconductor package solutions to complement the higher bandwidth, faster speed, higher frequency, and lower latency of 5G wireless communication chips. Referring to FIG. 1A, a sectional view of a 5G semiconductor package having an integrated antenna array is shown. A semiconductor package may include a package substrate 100 having a stacked patch antenna 102 embedded between layers of prepreg dielectric 104. For example, the integrated antenna 102 can be formed using industry standard subtractive processes, and the patches of the stacked patch antenna 102 may be separated by prepreg dielectric layers 104 laminated over a core layer 106 of package substrate 100. Prepreg dielectric layers 104 may include laminable buildup films (BF), and accordingly, four or more prepreg dielectric layers 104 may be required to obtain a suitable separation between the stacked antenna patches. Referring to FIG. 1B, a sectional view of an alternative 5G semiconductor package having an integrated antenna array is shown. A semiconductor package may include package substrate 100 having stacked patch antenna 102 embedded between layers of glass-cloth reinforced buildup material 108. Reinforced buildup material 108 may be thicker than BF, e.g., in a range of 100-150 µm, and accordingly, a suitable separation between stacked antenna patches may be obtained using two or more layers 108.

In FIGS. 1A-1B, the integrated antenna 102 may communicate with a die (not shown) mounted on package substrate 100. The illustrated structures may suffer from significant power losses when the die is operating at higher frequencies. For example, electrical interconnects 110 may include conventional, non-coaxial, traces and vias that suffer substantial signal loss at data transfer rates above 10 Gbit/sec. Furthermore, prepreg dielectric layers 104 and reinforced build up layers 108 may have insufficient stiffness to resist warpage during, e.g., a die attach process. That is, conventional buildup layer materials may experience warpage during fabrication or use.

In an aspect, a semiconductor package, e.g., a radio frequency integrated circuit (RFIC), having an integrated antenna array electrically connected to a die by a coaxial interconnect is provided. The semiconductor package can be fabricated using a die first, low-cost, panel-level packaging approach. The fan out-panel level packaging (FO-PLP) architecture, which may incorporate an embedded die and lithographically-defined coaxial interconnects, may experience lower power loss at high frequencies, and thus, may complement advanced wireless communication chips. For example, the semiconductor packages may be useful for chips having any data transfer rate when manufactured at comparable cost to existing solutions, or may be useful for chips operating at frequencies upwards of 30 GHz when manufacturing costs are marginally higher. Furthermore, the semiconductor package can include a molded layer formed from a molding compound. The molding layer may be stiffer than conventional buildup layers, and thus, may resist warpage during fabrication and use of semiconductor package.

Figure 2:
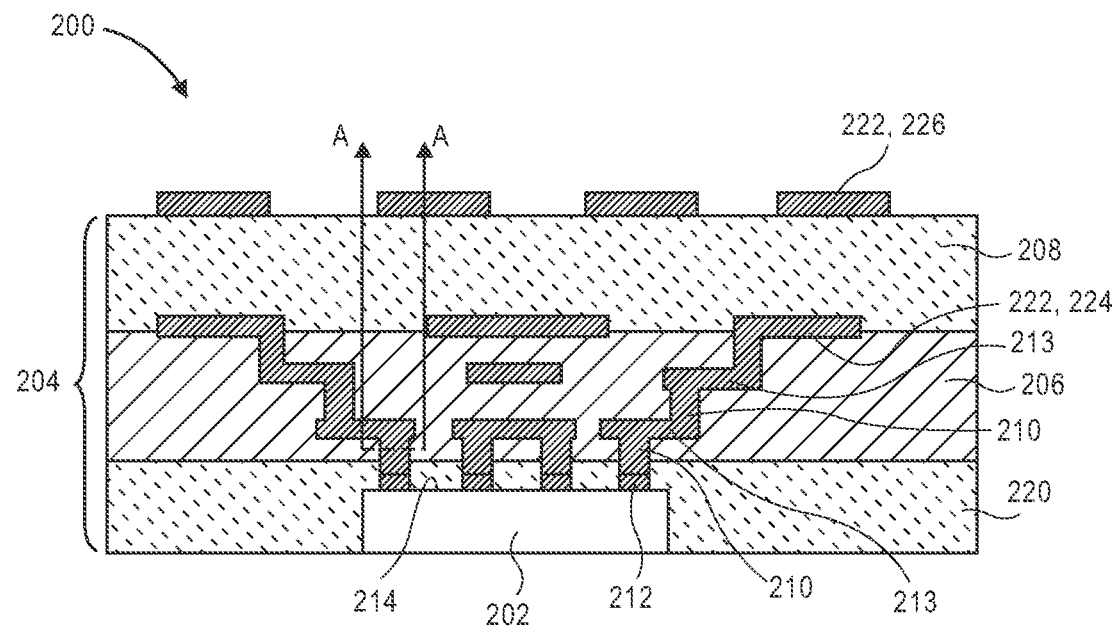
FIG. 2 illustrates a sectional view of a semiconductor package having a die electrically connected to an antenna by a coaxial interconnect, in accordance with an embodiment.

Referring to FIG. 2, a sectional view of a semiconductor package having a die electrically connected to an antenna by a coaxial interconnect is shown in accordance with an embodiment. A semiconductor package 200, e.g., an RFIC, may include a die 202 at least partly embedded in a package substrate 204. The use of an embedded-die architecture may provide for an ultra-thin semiconductor package 200. Furthermore, although semiconductor package 200 may be more thin than conventional 4G wireless communication packages, warpage of semiconductor package 200 may be avoided by the structure of package substrate 204. More particularly, package substrate 204 may include a redistribution layer 206 over die 202, and a molded layer 208 over redistribution layer 206. The combined stiffness of redistribution layer 206 and molded layer 208 (or a stiffness of molded layer 208 alone) may be sufficient to avoid warpage during fabrication and use of semiconductor package 200.

Redistribution layer 206 may include lithographically-defined waveguide and coaxial interconnect structures. More particularly, redistribution layer 206 may include a coaxial interconnect 210 electrically connected to die 202. Die 202 may include a die pad 212 on a die face 214, and coaxial interconnect 210 may extend from die pad 212 orthogonal to die face 214. In FIG. 2, coaxial interconnect 210 extends vertically through an embedding layer 220 that partially surrounds die 202. Redistribution layer 206 may include several lateral traces 213 extending horizontally through package substrate 204. For example, a lateral trace 213 may interconnect a first coaxial interconnect 210 extending vertically from die pad 212 with a second coaxial interconnect 210 laterally offset from the first coaxial interconnect 210. As described below, lateral traces 213 in redistribution layer 206 may be single signal lines, e.g., individual copper traces, coplanar waveguides, or grounded coplanar waveguides.

In an embodiment, lateral traces 213 are coplanar waveguides used to achieve high data transfer rates and low losses during transmission of signals from die 202 to an antenna 222. Coplanar waveguides extend laterally in a single plane. Such coplanar waveguides can include a central signal line flanked on either side by a pair of grounding lines. The three lines can run parallel to each other, and the central signal line can carry an electrical signal that remains isolated within the gap between the grounding lines. Coplanar waveguides may also be grounded. Grounded coplanar waveguides can include a ground plane below the signal line. Accordingly, in an embodiment, semiconductor package includes a hybrid waveguide structure including coaxial interconnects 210 providing vertical signal paths and coplanar waveguides providing horizontal/lateral signal paths. Coaxial interconnects 210 and lateral traces 213 may be lithographically formed over die 202 such that electrical connection is made to the die 202 without the use of solder balls, e.g., in a die mounting process. Accordingly, electrical performance of the redistribution layer 206 signal routing may be improved over non-embedded die architectures. The lithographically-defined electrical interconnect structure of redistribution layer 206 may also provide a high I/O density, which can provide a more compact semiconductor package 200.

In an embodiment, semiconductor package 200 includes antenna 222 mounted on package substrate 204. More particularly, antenna 222 may be a stacked patch antenna having a first antenna patch 224 and a second antenna patch 226, and each antenna patch may be mounted on a component or layer of package substrate 204. For example, first antenna patch 224 may be mounted on redistribution layer 206. Second antenna patch 226 may be mounted on molded layer 208. Antenna 222 may be electrically connected to die 202 through the electrical interconnects of redistribution layer 206. For example, first antenna patch 224 may be electrically connected to die pad 212 through coaxial interconnect(s) 210 and lateral trace(s) 213 of redistribution layer 206. Accordingly, coaxial interconnects 210 and lateral traces 213 in redistribution layer 206 may fan out electrical signals from die 202 to antenna 222. For example, coaxial interconnects 210 may carry an electrical signal vertically through package substrate 204, and lateral traces 213 may carry the electrical signal horizontally through package substrate 204 to fan out the electrical signal from die 202 to antenna 222.

In an embodiment, redistribution layer 206 is between die 202 and first antenna patch 224. First antenna patch 224 may be electrically coupled to coaxial interconnect 210. More particularly, lateral trace 213 of redistribution layer 206 may carry an electrical signal between coaxial interconnect 210 and first antenna patch 224.

In an embodiment, molded layer 208 is between first antenna patch 224 and second antenna patch 226. For example, first antenna patch 224 may be between redistribution layer 206 and a first side of molded layer 208, and second antenna patch 226 may be mounted on a second side of molded layer 208. That is, first antenna patch 224 may be on the first side of molded layer 208 and second antenna patch 226 may be on the second side of molded layer 208.

Molded layer 208 may resist warpage. In an embodiment, molded layer 208 includes a molding compound. For example, the molding compound may be an epoxy mold compound. The molding compound may be formulated based on desired properties. For example, the molding compound can be formulated to have a coefficient of thermal expansion (CTE) similar to die 202. For example, die 202 may be a silicon die having a CTE of 3 ppm/K. The CTE of molding compound may be in a range of 5-15 ppm/K, e.g., 9-10 ppm/K. As described below, molded layer 208 may be formed by compression molding the molding compound. The molding compound can be a material having a stiffness higher than BF or glass-cloth reinforced buildup materials. By way of example, molding compound can have a Young's modulus more than 5 GPa, e.g., between 7-10 GPa. Furthermore, molded layer 208 may have a thickness that is higher than a thickness of prepreg dielectric layers 104 or reinforced buildup material layers 108. By way of example, molded layer 208 may have a layer thickness of at least 100 microns. In an embodiment, the layer thickness of molded layer 208 is greater than 150 microns. Accordingly, molded layer 208 has a stiffness and dimension that resists warpage during fabrication and use of semiconductor package.

Figure 3:
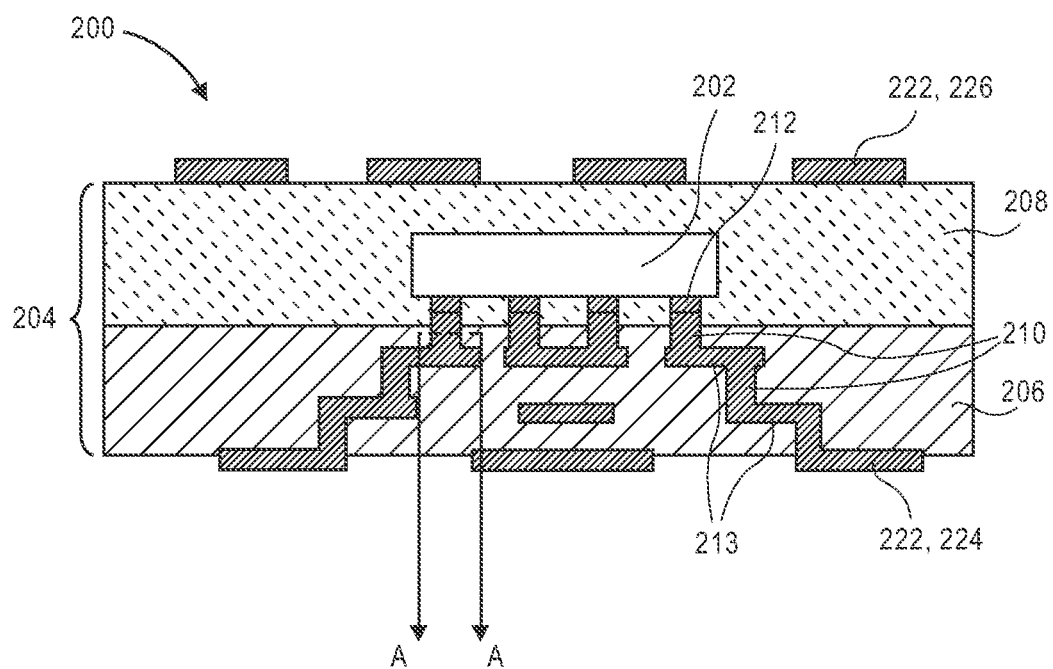
FIG. 3 illustrates a sectional view of a semiconductor package having a die electrically connected to an antenna by a coaxial interconnect, in accordance with an embodiment.

Referring to FIG. 3, a sectional view of a semiconductor package having a die electrically connected to an antenna by a coaxial interconnect is shown in accordance with an embodiment. In an embodiment, die 202 is mounted on package substrate 204. That is, die 202 may be on an outer surface of package substrate 204, or may be on a portion of package substrate 204 within the substrate body. For example, die 202 may be at least partly embedded in molded layer 208. Accordingly, molded layer 208 may cover one or more sides of die 202. When molded layer 208 covers all sides of die 202, i.e., when molded layer 208 surrounds die 202, die 202 is fully embedded in mold layer (FIG. 3).

In addition to resisting warpage, the layer thickness of molded layer 208 may be selected to optimize antenna performance. More particularly, in an embodiment, molded layer 208 is between first antenna patch 224 and second antenna patch 226, and therefore affects an interaction between first antenna patch 224 and second antenna patch 226 during operation. Similarly, first antenna patch 224 may be on an outer surface of redistribution layer 206 and second antenna patch 226 may be on an outer surface of molded layer 208 on an opposite side of package substrate 204 than first antenna patch 224. That is, molded layer 208 and redistribution layer 206 may both be between the antenna patches, and a distance between the antenna patches may include a combined thickness of molded layer 208 and redistribution layer 206. Accordingly, the layers of package substrate 204 between first antenna patch 224 and second antenna patch 226 may be individually selected to achieve a desired separation and isolation between first antenna patch 224 and second antenna patch 226.

As described above, whether die 202 is embedded fully within molded layer 208, mounted on an outer surface of package substrate 204, or partly embedded within a portion, e.g., embedding layer 220, of package substrate 204 (FIG. 2), die 202 may include die pad 212 electrically coupled to coaxial interconnect 210. Furthermore, coaxial interconnect 210 may extend through package substrate 204, e.g., through molded layer 208, to a lateral trace 213. Accordingly, lateral trace 213 may carry the electrical signal from coaxial interconnect 210 between die pad 212 and first antenna patch 224.

Figure 4:
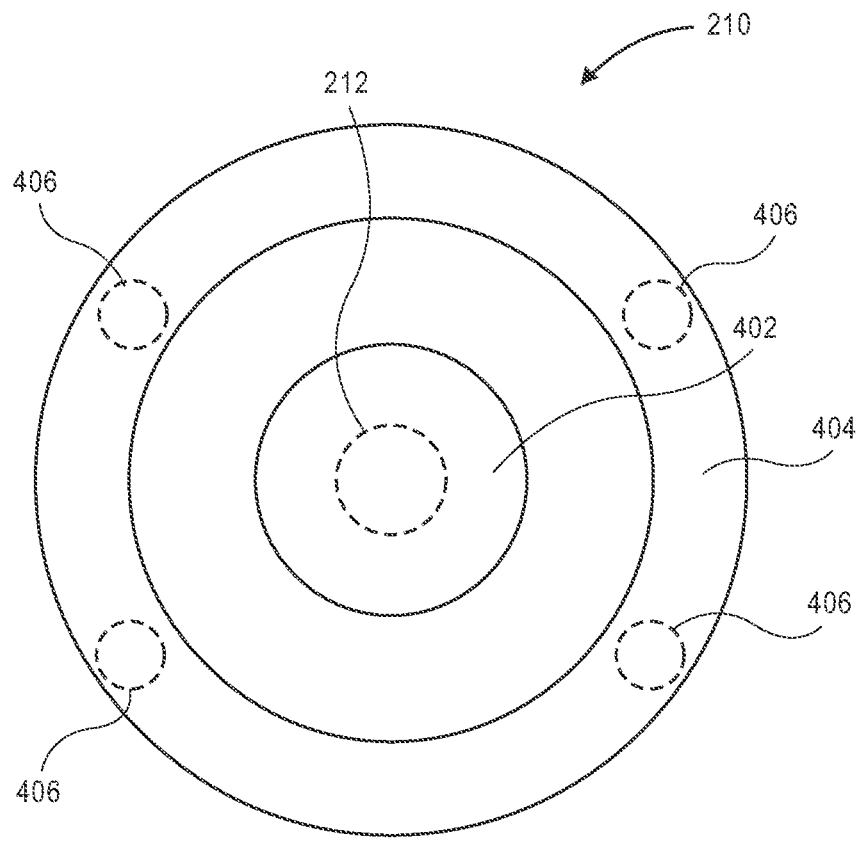
FIG. 4 illustrates a sectional view, taken about line A-A of FIGS. 2 and 3, of a coaxial interconnect, in accordance with an embodiment.

Referring to FIG. 4, a sectional view, taken about line A-A of FIGS. 2 and 3, of a coaxial interconnect is shown in accordance with an embodiment. Coaxial interconnect 210 can extend vertically through package substrate 204 from die pad 212. Coaxial interconnect 210 has a coaxial configuration. More particularly, coaxial interconnect 210 can include a signal trace 402 extending from die pad 212, and a shield conductor 404 surrounding signal trace 402. In an embodiment, shield conductor 404 extends from a second die pad 406 on die face 214. For example, an array of die pads may be formed on die face 214. The array may include several die pads 406 formed at corners of a rectangular pattern centered about die pad 212. In an embodiment, shield conductor 404 is formed over one or more of the second die pads 406 distributed laterally around die pad 212 in the rectangular. Thus, die pad 212 may transmit or receive electrical signals from signal trace 402, and second die pad(s) 406 may maintain a ground potential of shield conductor 404.

Signal trace 402 and shield conductor 404 may be concentric. That is, the coaxial signal trace 402 and shield conductor 404 can share a same central axis that extends orthogonal to die face 214 and vertically through package substrate 204. The concentricity of signal trace 402 and shield conductor 404 may also be expressed in terms of the relationship between respective cross-sectional areas of the conductors. For example, signal trace 402 and shield conductor 404 may have respective cross-sectional areas having respective shapes, e.g., circular or polygonal, and the shapes may be concentric, i.e., concentric shapes.

An outer surface of signal trace 402 may be separated from an inner surface of shield conductor 404 by a gap. In an embodiment, a signal insulation material fills the gap between signal trace 402 and shield conductor 404 of coaxial interconnect 210. That is, signal insulation material can separate signal trace 402 from shield conductor 404. Signal trace 402 and shield conductor 404 of coaxial interconnect 210 can be formed from copper such that, during operation, signal trace 402 can carry a data signal and shield conductor 404 can be maintained at a ground potential. Thus, electric and magnetic fields from the data signal may be restricted to the gap region of coaxial interconnect 210, and there may be essentially no signal loss even at data transfer rates above 100 Gbit/sec.

Shield conductor 404 may have an annular cross-sectional area to surround signal trace 402. Here, the term annular does not necessarily require a circular ring shape as shown in FIG. 4. Rather, an annular structure of shield conductor 404 may be a cross-sectional shape having an outer surface of any profile, e.g., rectangular, and an inner surface of any profile, e.g., circular. The inner profile, however, fully (or at least mostly) surrounds signal trace 402. For example, the shape may extend around at least half of an outer profile of signal trace 402. Thus, the cross-sectional shape of shield conductor 404 may be considered to be annular.

Figure 5:
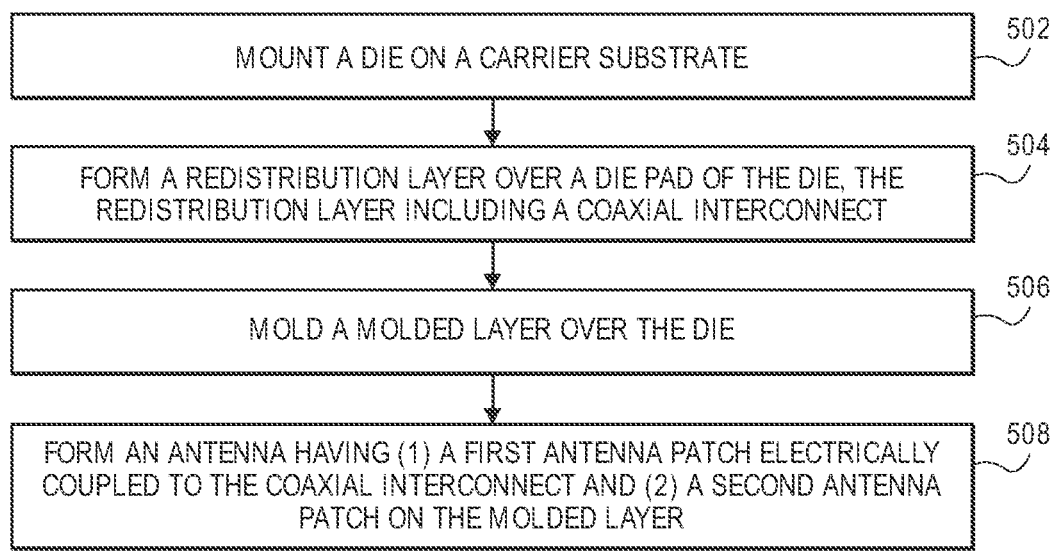
FIG. 5 illustrates a flowchart of a method of fabricating a semiconductor package having a die electrically connected to an antenna by a coaxial interconnect, in accordance with an embodiment.

Referring to FIG. 5, a flowchart of a method of fabricating a semiconductor package having a die electrically connected to an antenna by a coaxial interconnect is shown in accordance with an embodiment. The operations of FIG. 5 are applicable to the sequences of operations shown in FIGS. 6A-6G and 9A-9G. More particularly, the illustrated operations of FIGS. 6A-6G and 9A-9G correspond to the operations of FIG. 5, albeit in different orders or with particular differences as described below. Accordingly, FIGS. 6A-6G and 9A-9G are both described below by referencing the operations of FIG. 5.

Figure 6A:
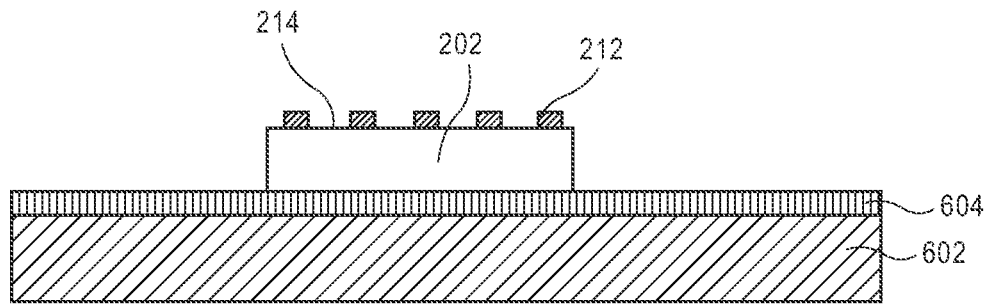
FIGS. 6A-6G illustrate operations in a method of fabricating a semiconductor package having a die electrically connected to an antenna by a coaxial interconnect, in accordance with an embodiment.

Referring to FIGS. 6A-6G, operations in a method of fabricating a semiconductor package having a die electrically connected to an antenna by a coaxial interconnect are shown in accordance with an embodiment. Referring to FIG. 6A, at operation 502, die 202 is mounted on a carrier substrate 602. Carrier substrate 602 may be any rigid carrier material. For example, carrier substrate 602 may be a stainless steel or glass carrier substrate.

A bonding material may be laminated on top of carrier substrate 602. For example, the bonding material may be a two-sided release tape 604 laminated on carrier substrate 602. The two-sided release tape 604 can be a special tape that has a first side that is thermal releasable, and a second side having a pressure sensitive adhesive. The thermal side of two-sided release tape 604 may be placed against carrier substrate 602 to allow the tape to be released from carrier substrate 602 using a heat treatment process. Two-sided release tape 604 is described by way of example, however, and other bonding materials such as a UV releasable tape may be used to hold die 202 on carrier substrate 602.

Die 202 may be mounted on two-sided tape 604. Die 202 can be placed on two-sided tape 604 using a die mount or a pick-and-place tool. In an embodiment, die 202 is mounted on carrier substrate 602 such that a back side of die 202 contacts two-sided tape 604 and/or die face 214 faces away from carrier substrate 602. That is, die 202 may be placed onto tape 604 face up such that die pads 212 face up.

Figure 6B:
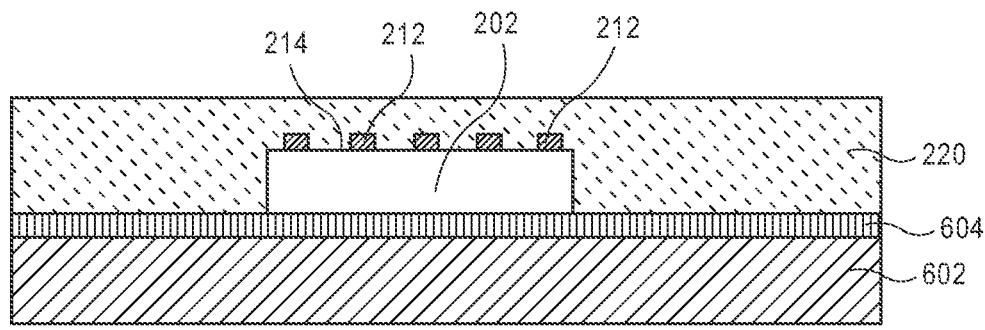

Referring to FIG. 6B, die 202 may be over-molded to form embedding layer 220 over die 202. Embedding layer 220 may cover die face 214 and die pads 212. Embedding layer 220 may include a molding compound. For example, embedding layer 220 and molded layer 208 may be formed from a same molding compound. The over-molding process used to form embedding layer 220 may be a compression molding process. That is, molding compound can be dispensed onto die 202 and two-sided tape 604 over carrier substrate 602, and the molding compound can be compression molded to embed die 202 in embedding layer 220.

Figure 6C:
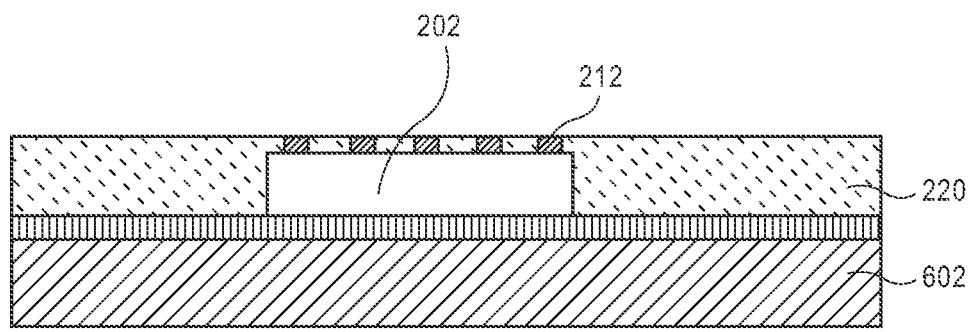

Referring to FIG. 6C, die pads 212 of die 202 may be exposed. In an embodiment, embedding layer 220 is partially removed by a grinding process. More particularly, a portion of embedding layer 220 over die pads 212 is ground or polished to reveal die pads 212. Optionally, die bumps may be formed on the exposed die pads 212 using lithographic techniques. Suboperations of the die bump formation process are described in more detail below with respect to FIGS. 7A-7D. Die pads 212 and die bumps may be arranged in a pattern, such as a grid or an array. For example, an array of die bumps may include a central bump surrounded by several lateral bumps. It will be appreciated that die bump formation is option. In an embodiment, die pads 212 may have the configuration, geometry, and distribution on die 202 to allow for the formation of redistribution 206 and coaxial interconnects 210 in redistribution layer 206, as described below. Accordingly, the die bump formation process described with respect to FIGS. 7A-7D may be unnecessary in certain embodiments.

Figure 6D:
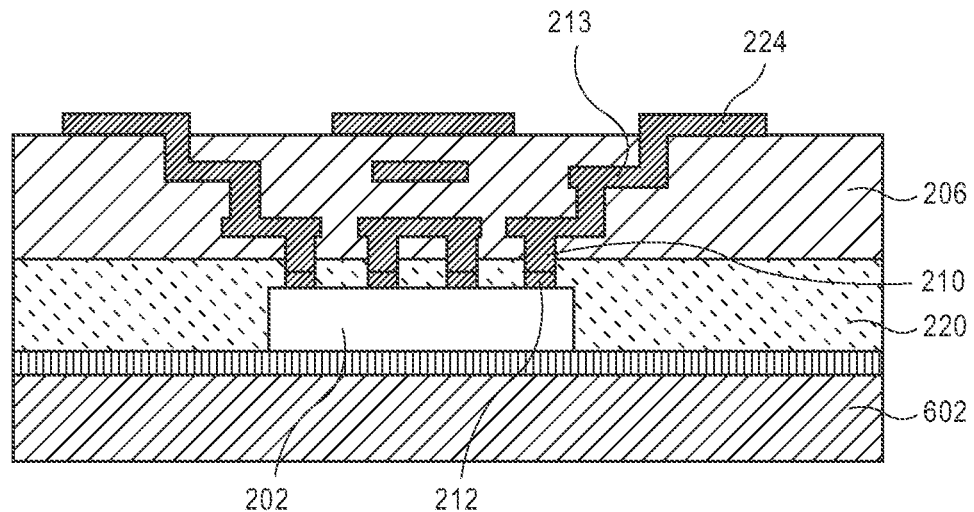

Referring to FIG. 6D, at operation 504, redistribution layer 206 is formed over die pad 212 of die 202. Redistribution layer 206 includes coaxial interconnect 210 extending vertically from die pad 212. The formation of coaxial interconnect 210 on die pads 212 and die bumps of die 202 is described in more detail with respect to FIGS. 8A-8F below. When coaxial interconnect 210 is formed, signal trace 402 may be formed on the central bump of a die bump array and shield conductor 404 may be formed on the lateral bumps of the die bump array. Redistribution layer 206 may include lateral traces 213 and first antenna patch 224.

Figure 6E:
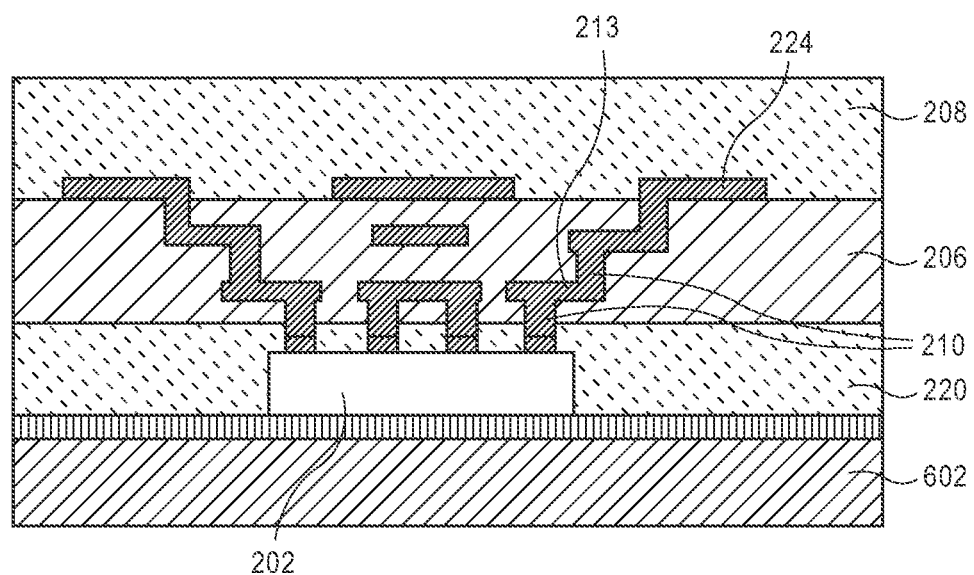

Referring to FIG. 6E, at operation 506, molded layer 208 is molded over die 202. Molded layer 208, in an embodiment, is formed over die 202, which is below redistribution layer 206 formed at operation 504. Accordingly, in a sequence, when molded layer 208 is molded over die 202, it is also molded over redistribution layer 206 and any other structures that are between molded layer 208 and die 202. In an embodiment, molded layer 208 includes a molding compound. For example, after a desired number of routing layers having respective coaxial interconnect(s) 210 and lateral trace(s) 213 is formed in redistribution layer 206, the molding compound may be dispensed onto redistribution layer 206 and molded in a molding process, e.g., a compression molding process. Accordingly, molded layer 208 may be in direct contact with and cover redistribution layer 206. Redistribution layer 206 can separate molded layer 208 from embedding layer 220 that partially surrounds die 202. More particularly, molded layer 208 may be over and above die 202.

The molding process used to form molded layer 208 can include compression molding, however, that is only one option. For example, molded layer 208 may be formed using a transfer mold or any other molding process that is applicable to the selected molding compound, and processing capabilities, e.g., heat/pressure tolerances, of the other structures in semiconductor package 200.

Molded layer 208 can be formed to have a layer thickness greater than conventional prepreg dielectric layers 104 or glass reinforced layers 108. The molding process, e.g., the compression molding process, can be adjusted to define molded layer 208 having a thickness that provides sufficient stiffness to resist warpage, and/or to separate the antenna patches of an antenna array by a predetermined distance.

Figure 6F:
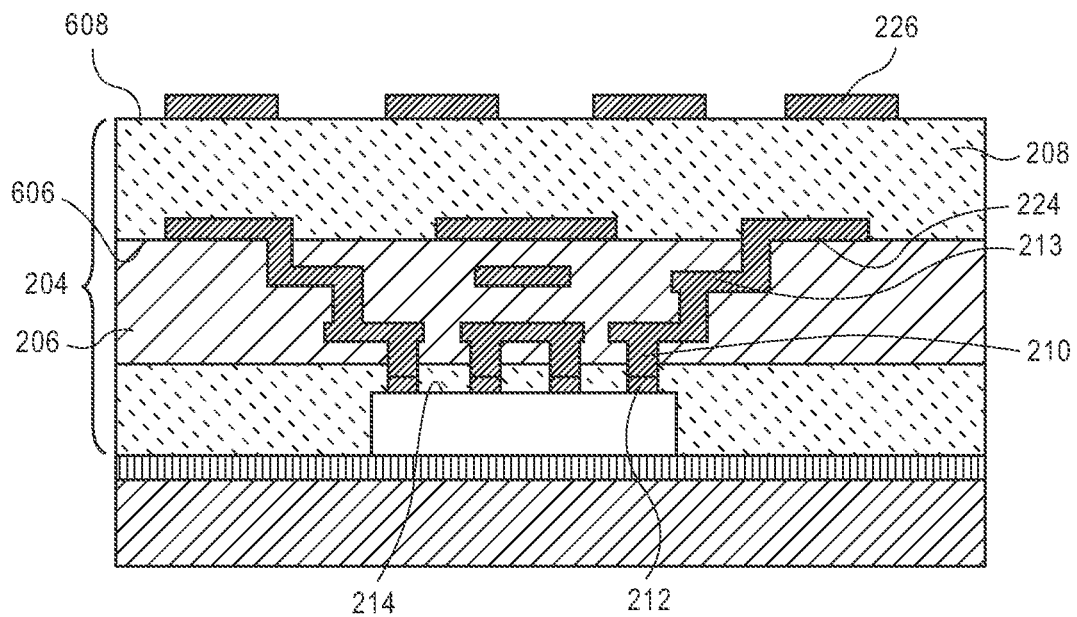

Referring to FIG. 6F, at operation 508, antenna 222 is formed on package substrate 204. Formation of antenna 222 may include the formation of first antenna patch 224 during the fabrication of redistribution layer 206, as noted above. For example, first antenna patch 224 may be formed on redistribution layer 206, e.g., on a top surface of redistribution layer 206. First antenna patch 224 may be electrically coupled to coaxial interconnect 210 of redistribution layer 206. Lateral trace 213 of redistribution layer 206 may extend parallel to die face 214 of die 202 to carry an electrical signal between die pad 212 and first antenna patch 224, e.g., via coaxial interconnect 210. After forming molded layer 208 over redistribution layer 206, first antenna patch 224 may be sandwiched between molded layer 208 and redistribution layer 206. Accordingly, the formation of antenna 222 may include forming first antenna patch 224 on a first side 606 of molded layer 208.

The formation of antenna 222 may also include forming a second antenna patch 226 on molded layer 208. More particularly, second antenna patch 226 may be formed on a second side 608 of molded layer 208. First antenna patch 224 and second antenna patch 226 may be fabricated using known processes, such as electroless copper plating processes. Accordingly, the antenna array may be formed integral to package substrate 204 and in electrical communication with die 202.

Figure 6G:
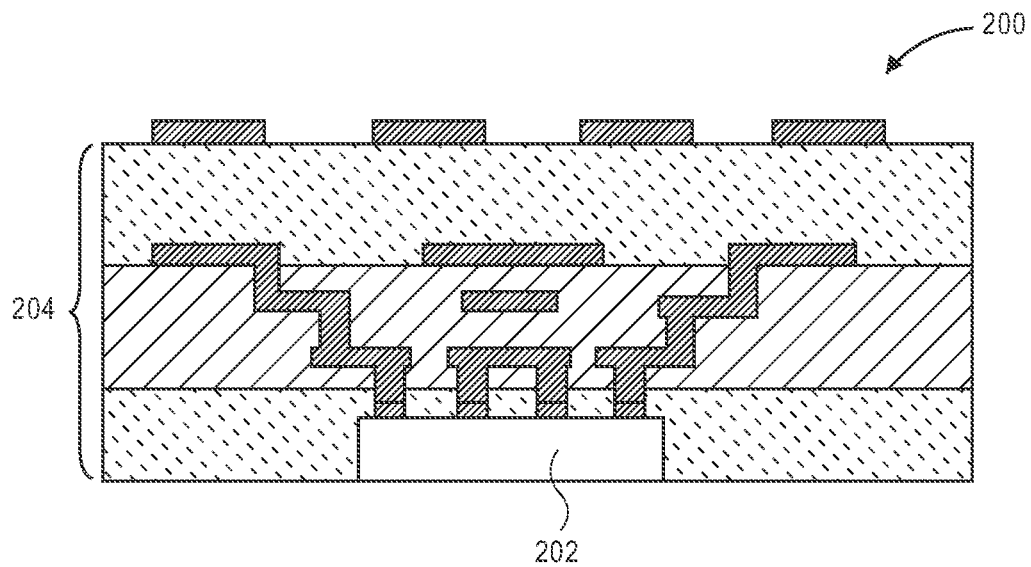

Referring to FIG. 6G, package substrate 204 may be detached from carrier substrate 602. The detached package substrate 204 may be part of a larger panel having several elements such as semiconductor package 200 shown in FIG. 6G. for example, a full panel having conventional dimensions, such as 510 mm by 515 mm or 600 mm×600 mm, may be fabricated to include several semiconductor packages 200. After detaching the panel from carrier substrate 602, the panel may be singulated into semiconductor package 200 as shown. Accordingly, it will be appreciated that although a single element has been illustrated for simplicity, the manufacturing processes described herein can be applied at a panel level. The singulated semiconductor package 200 can have the structure described above with respect to FIG. 2.

Figure 7A:
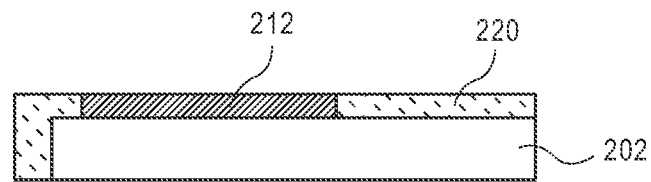
FIGS. 7A-7D illustrate suboperations for forming die bumps of a semiconductor package having a die electrically connected to an antenna by a coaxial interconnect, in accordance with an embodiment.

Referring to FIGS. 7A-7D, suboperations for forming the optional die bumps of a semiconductor package having a die electrically connected to an antenna by a coaxial interconnect are shown in accordance with an embodiment. The suboperations of FIGS. 7A-7D are referenced above as intermediate suboperations between the grinding of embedding layer 220 and the formation of redistribution layer 206. The formation of die bumps may occur at other times, however, such as prior to molding embedding layer 220 over die 202. Similarly, the formation of die bumps may be omitted when die pads 212 already have the requisite structure needed to connect to coaxial interconnects 210. Referring to FIG. 7A, a top surface of die pad 212 may be exposed. For example, the top surface may be coplanar with a top surface of the molded and ground embedding layer 220.

Figure 7B:
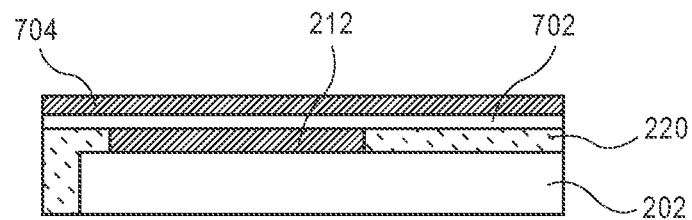

Referring to FIG. 7B, a seed layer may be formed over the exposed die pad 212. For example, a titanium sublayer 702 and a copper sublayer 704 may be deposited over the top surfaces of die pad 212 and embedding layer 220. The seed layer may be a single layer of sputtered titanium and copper, by way of example.

Figure 7C:
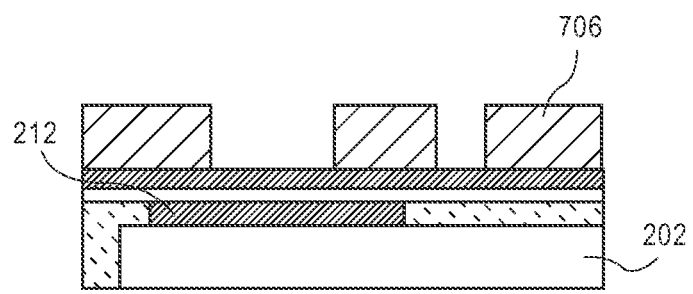

Referring to FIG. 7C, a dry film resist layer 706 may be laminated over the seed layer. Dry film resist layer 706 may be exposed and developed to form holes within which die bumps are to be formed. More particularly, the holes in dry film resist layer 706 may be developed over die pad 212 of die 202.

Figure 7D:
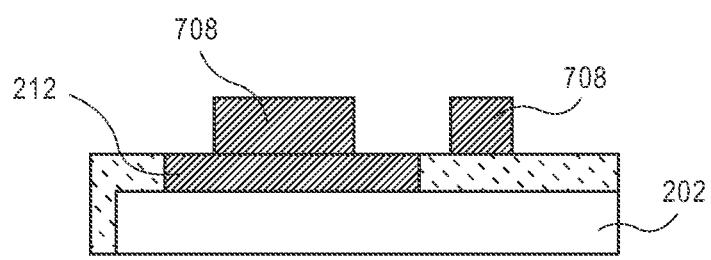

Referring to FIG. 7D, die bumps 708 may be formed within the holes of dry film resist layer 706. For example, electroless copper plating may be used to deposit copper into the holes. The seed layer may be stripped away, and dry film resist layer 706 may be removed, to provide die bumps 708 extending upward from corresponding die pads 212. Coaxial interconnect 210 can subsequently be formed on die bumps 708, as described below.

Referring to FIGS. 8A-8F, suboperations for forming a coaxial interconnect of a semiconductor package having a die electrically connected to an antenna by the coaxial interconnect are shown in accordance with an embodiment. The suboperations of FIGS. 8A-8F are referenced above as a part of the formation of redistribution layer 206. Although the following description is specifically directed to the formation of coaxial interconnect 210 over die pads 212, similar suboperations may be used to fabricate coaxial interconnects 210 laterally offset from die pads 212, e.g., extending upward from lateral traces 213 to first antenna patch 224. For example, in a sublayer of redistribution layer 206, signal trace 402 may be formed on an end of a signal line of a coplanar waveguide, rather than on a die pad 212 or a die bump 708 as described below. Accordingly, the specific formation illustrated in FIGS. 8A-8F is illustrative of a coaxial interconnect formation process, but is not restricted to a particular location within semiconductor package 200.

Figure 8A:
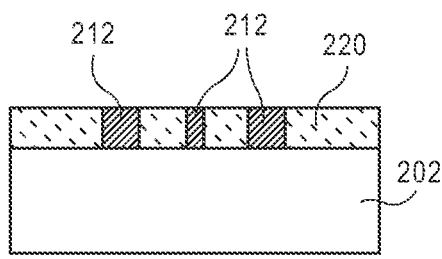
FIGS. 8A-8F illustrate suboperations for forming a coaxial interconnect of a semiconductor package having a die electrically connected to an antenna by the coaxial interconnect, in accordance with an embodiment.
Figure 8B:
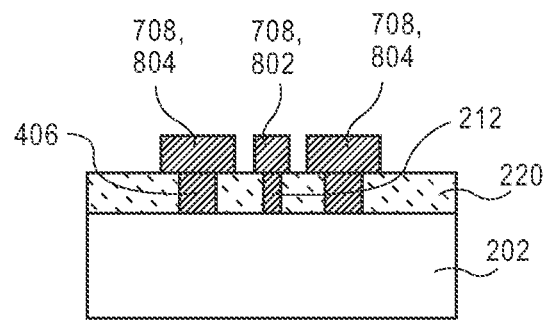

The fabrication of coaxial interconnects 210 may include a litho-defined trench process. The process may essentially include litho-plating suboperations that first fabricate a lower coaxial ground shield, and subsequently fabricate a signal-carrying trace and sidewall ground shielding. Referring to FIG. 8A, die pads 212 may be exposed. For example, a top surface of die pads 212 may be coplanar with a top surface of embedding layer 220. Referring to FIG. 8B, die bumps 708 may be formed on die pads 212. Die pads 212 and die bumps 708 may be arranged in an array. For example, the die bumps array may include a central bump 802 surrounded by several lateral bumps 804. Central bump 802 may be formed on die pad 212, and lateral bumps 804 may be formed on second die pad 406 (FIG. 4). Die bumps 708 may extend above embedding layer 220.

Figure 8C:
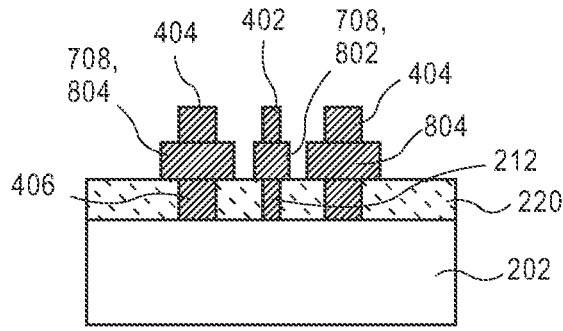

Referring to FIG. 8C, signal trace 402 and shield conductor 404 may be formed over die pads 212 and die bumps 708. For example, signal trace 402 may be formed on central bump 802, and shield conductor 404 may be formed on lateral bumps 804. Thus, signal trace 402 may be formed on die pad 212, and shield conductor 404 may be formed on second die pad 406 laterally outward from die pad 212. Fabrication of signal trace 402 and shield conductors 404 can include seed deposition, resist patterning, and seed etch operations. This process flow is not illustrated for the sake of brevity. It will be appreciated, however, that because coaxial interconnect 210 is fabricated using lithographic processes, sidewalls of the coaxial interconnect 210 and lateral traces 213 can be vertical and non-sloped. Accordingly, semiconductor package 200 fabricated using the processes described here may be distinguished from semiconductor package 200 fabricated using alternative processes, e.g., laser drilling, which create interconnect structures having sloped sidewalls. Die bumps 708 may be in an array pattern, however, shield conductor 404 and signal trace 402 may be coaxial. That is, shield conductor 404 may have an annular cross-sectional area extending along a path that traverses several lateral bumps 804. The annular cross-sectional area may surround signal trace 402. Accordingly, signal trace 402 may extend upward from central bump 802 and shield conductor 404 may extend upward from several lateral bumps 804.

Figure 8D:
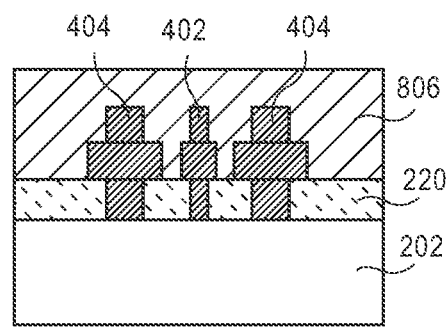

Referring to FIG. 8D, a dielectric layer 806 can be laminated over signal trace 402 and shield conductor 404 of coaxial interconnect 210. Dielectric layer 806 can include an organic dielectric. For example, dielectric layer 806 may be a low loss BF, e.g., prepreg dielectric film laminated over embedding layer 220.

Figure 8E:
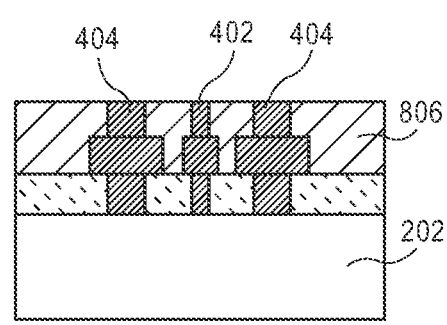
Figure 8F:
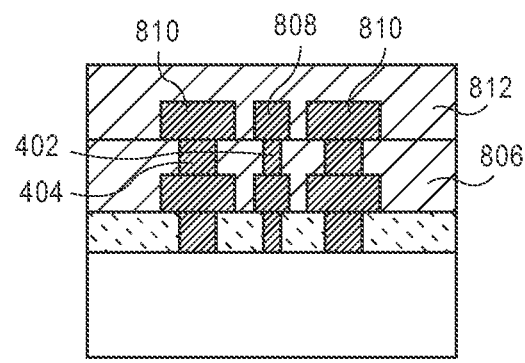

Referring to FIG. 8E, dielectric layer 806 may be etched back to expose a top surface of signal trace 402 and shield conductor 404 of coaxial interconnect 210. Referring to FIG. 8F, a second layer of redistribution layer 206 may be formed over the top surfaces of signal trace 402 and shield conductor 404. For example, the second layer may include another segment of coaxial interconnect 210 having a signal trace extending upward from signal trace 402 in the first layer and a shield conductor extending upward from shield conductor 404 in the first layer. Alternatively, the second layer may include a lateral trace 213, which is a coplanar waveguide. For example, lateral trace 213 which is a coplanar waveguide may include a central conductor 808, i.e., a signal line, of a coplanar waveguide lateral trace, and a pair of shield traces 810, i.e., grounding lines of the coplanar waveguide, flanking the central conductor 808. Central conductor 808 and shield traces 810 may run parallel in a lateral direction such that shield traces 810 remain at a defined spacing apart from central conductor 808.

In an embodiment, lateral trace 213 connected to a coaxial interconnect structure may be a grounded co-planar waveguide. The grounded co-planar waveguide may include an additional grounding trace (not shown) in a metal layer of redistribution layer 206 beneath the central conductor 808. The selection of lateral trace 213 as a single trace, a coplanar waveguide, or a grounded coplanar waveguide can be made based on bandwidth and noise requirements of semiconductor package 200. For example, grounded coplanar waveguides may provide optimal bandwidth and noise performance that may be weighed against manufacturing cost considerations.

The second layer may include a second dielectric layer 812 laminated over the coaxial interconnect or coplanar waveguide structures in the second layer. Layering of coaxial interconnect structures and lateral traces 213 may be continued as needed to build up redistribution layer 206 and to fan out electrical signals from die 202 to antenna 222.

Referring to FIGS. 9A-9G, operations in an alternative method of fabricating a semiconductor package having a die electrically connected to an antenna by a coaxial interconnect are shown in accordance with an embodiment. The operations of FIGS. 9A-9G are similar to those described with respect to FIGS. 6A-6G, but differ as described below. In part, FIGS. 9A-9G differ in the sequence of operations performed with respect to the method of FIG. 5.

Figure 9A:
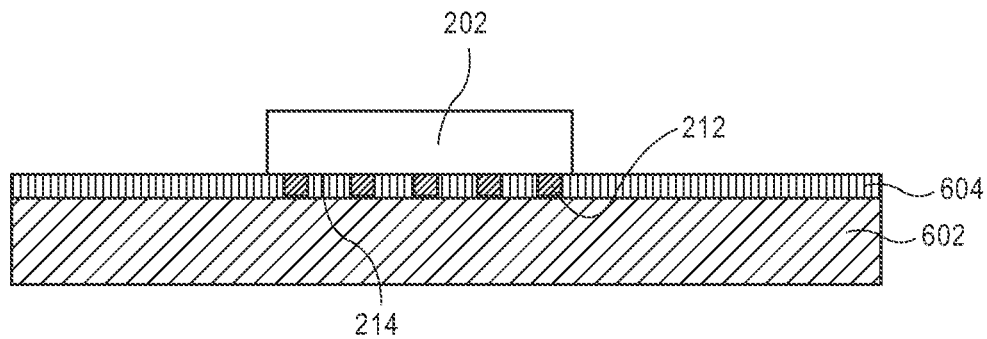
FIGS. 9A-9G illustrate operations in an alternative method of fabricating a semiconductor package having a die electrically connected to an antenna by a coaxial interconnect, in accordance with an embodiment.

Referring to FIG. 9A, at operation 502, die 202 is mounted on carrier substrate 602. In an embodiment, die 202 is mounted on carrier substrate 602 such that a back side of die 202 is exposed and die face 214 faces a top surface of carrier substrate 602. That is, die 202 may be placed onto two-sided tape 604 face down such that die pads 212 attach to two-sided tape 604 and a back side of die 202 faces up.

Figure 9B:
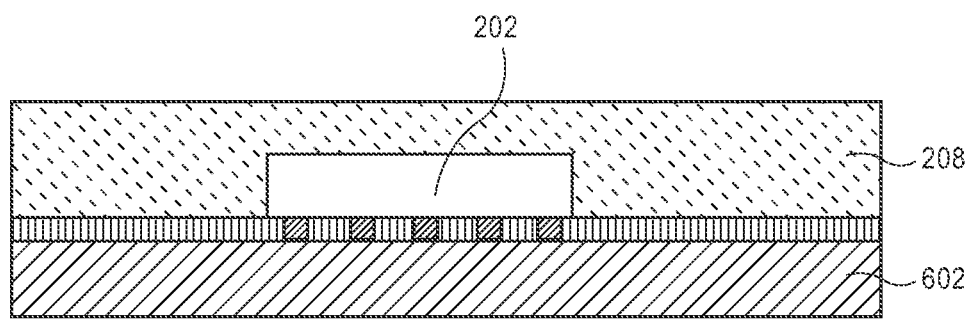

Referring to FIG. 9B, at operation 506, molded layer 208 is molded over die 202. Die 202 may be over-molded to form molded layer 208 over the back side of die 202.

Molded layer 208 may include a molding compound dispensed and compression molded as described above. Accordingly, molded layer 208 may be in direct contact with die 202. In an embodiment, molded layer 208 covers a back side and lateral sides of die 202.

Figure 9C:
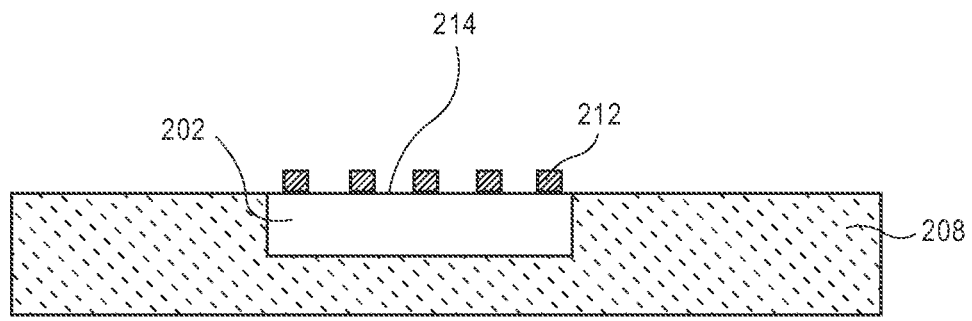

Referring to FIG. 9C, carrier substrate 602 may be detached from die 202 to expose a front side of die 202. Carrier substrate 602 can be released by a heat treatment. Die face 214 having die pads 212 may be exposed and coplanar with an upper surface of molded layer 208. Accordingly, the over-molded die 202 may serve as a core of package substrate 204. As described above, the thickness and material of molded layer 208 may be selected to ensure that the core has sufficient stiffness to resist warpage during fabrication and use. After exposing die pads 212, die bumps 708 may be formed on die pads 212 in a die bump formation process (FIGS. 7A-7D).

Figure 9D:
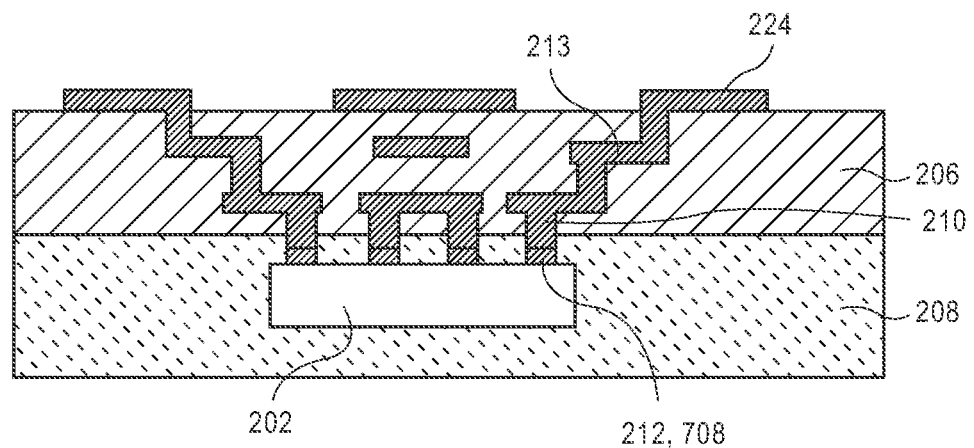

Referring to FIG. 9D, at operation 504, redistribution layer 206 may be formed over die pads 212 of die 202. Redistribution layer 206 can include coaxial interconnect 210 formed over die pads 212 and die bumps 708 (FIGS. 8A-8F). Redistribution layer 206 may also include lateral trace(s) 213 and first antenna patch 224, as described above.

Figure 9E:
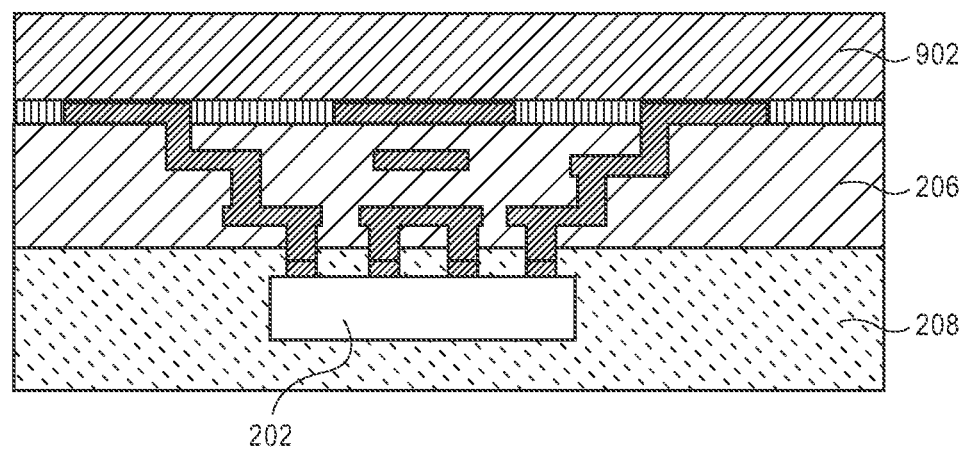

Referring to FIG. 9E, when redistribution layer 206 is completed, the panel can be attached to a temporary carrier 902. The temporary carrier 902 may be similar to carrier substrate 602, and may be covered by a bonding material. Accordingly, temporary carrier 902 can hold redistribution layer 206 during subsequent operations.

Figure 9F:
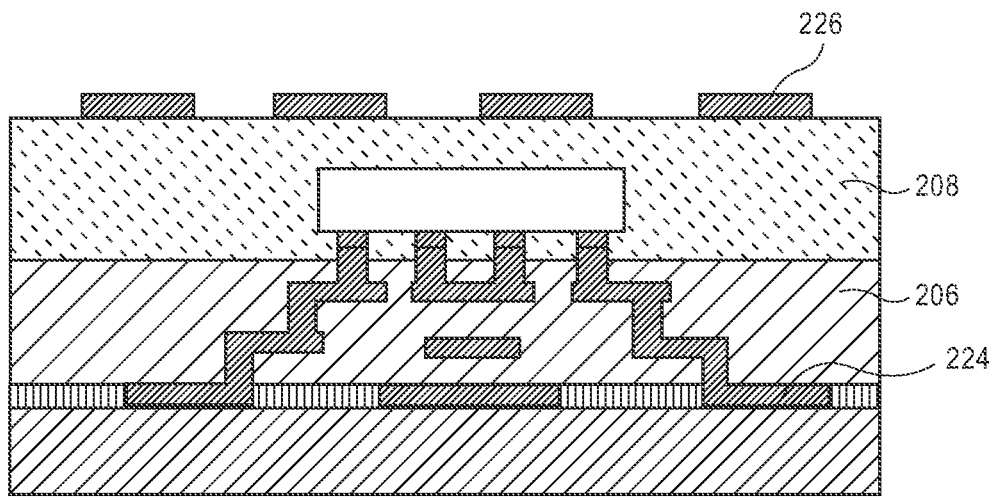

Referring to FIG. 9F, at operation 508, antenna 222 is formed. As described above, first antenna patch 224 may be formed as part of redistribution layer 206. Second antenna patch 226 may be formed on molded layer 208 over first antenna patch 224. Accordingly, first antenna patch 224 and second antenna patch 226 may be separated by a combined thickness of redistribution layer 206 and molded layer 208.

Figure 9G:
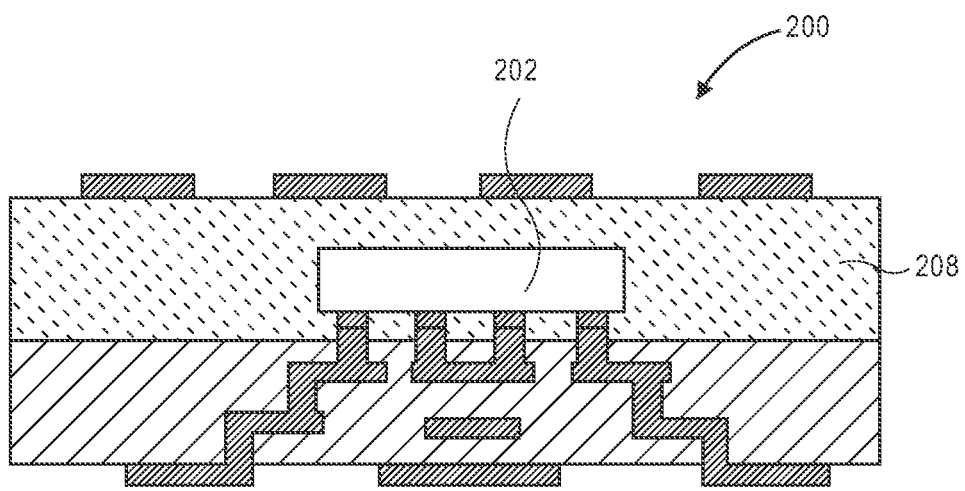

Referring to FIG. 9G, the panel having die 202 fully embedded in molded layer 208 may be detached from temporary carrier 902. Individual elements of the panel may then be singulated to form semiconductor package 200. The singulated semiconductor package 200 can have the structure described above with respect to FIG. 3.

Figure 10:
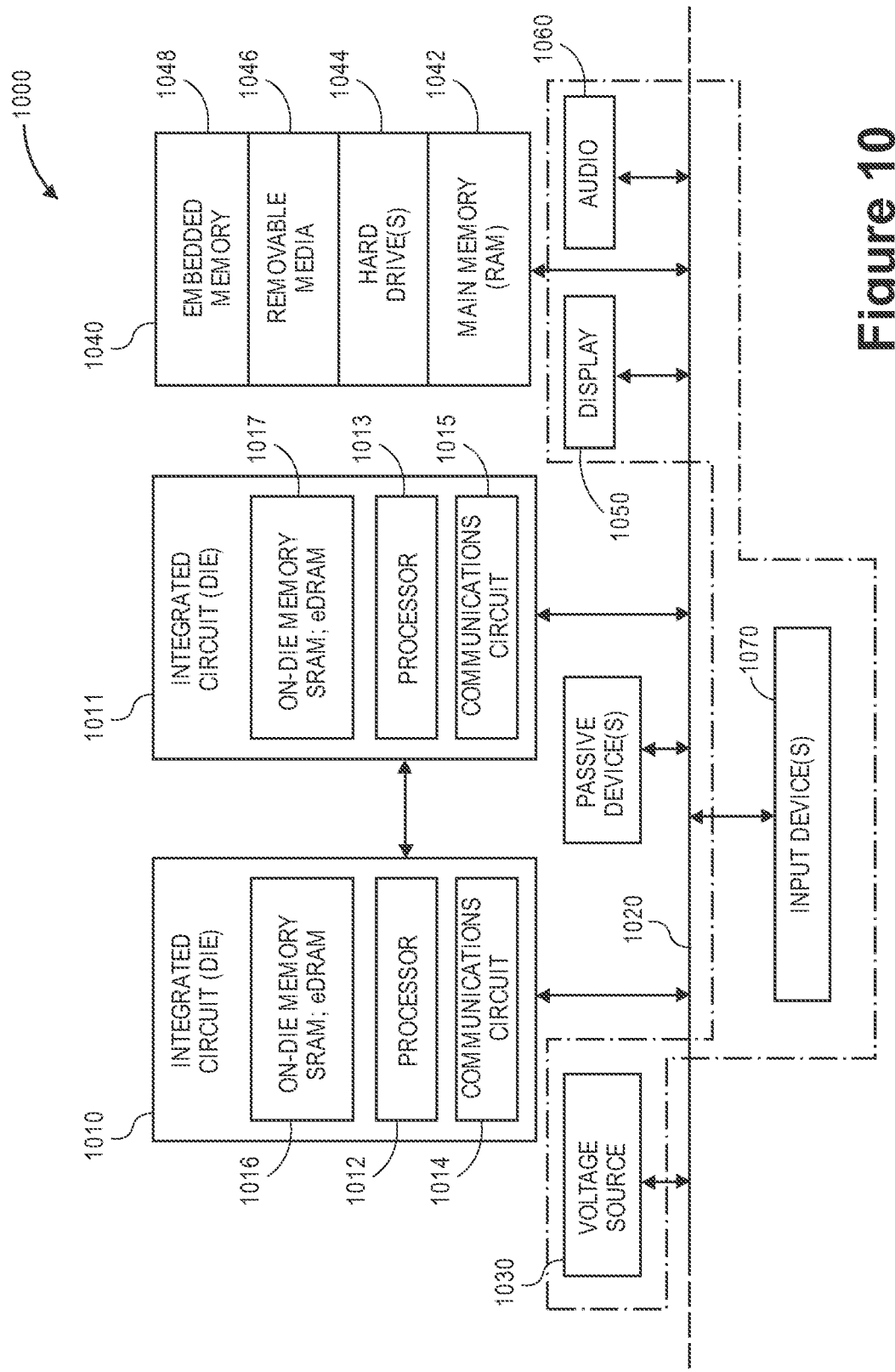
FIG. 10 is a schematic of a computer system, in accordance with an embodiment.

FIG. 10 is a schematic of a computer system, in accordance with an embodiment. The computer system 1000 (also referred to as the electronic system 1000) as depicted can embody a semiconductor package having a die electrically connected to an antenna by a coaxial interconnect as described according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a semiconductor package having a die electrically connected to an antenna by a coaxial interconnect, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1011 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, and an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a semiconductor package having a die electrically connected to an antenna by a coaxial interconnect, according to any of the several disclosed embodiments and their equivalents, an electronic system, a computer system, one or more methods of fabricating an integrated circuit, and one or more methods of fabricating an electronic assembly that includes a semiconductor package having a die electrically connected to an antenna by a coaxial interconnect, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor package having a die electrically connected to an antenna by a coaxial interconnect embodiments and their equivalents. A foundation substrate may be included, as represented by the dashed line of FIG. 10. Passive devices may also be included, as is also depicted in FIG. 10.

Embodiments of semiconductor packages having a die electrically connected to an antenna by a coaxial interconnect are described above. In an embodiment, a radio frequency integrated circuit (RFIC) includes a die including a die pad on a die face. The RFIC includes a redistribution layer over the die. The redistribution layer includes a coaxial interconnect extending from the die pad orthogonal to the die face. The RFIC includes a molded layer over the redistribution layer. The molded layer includes a molding compound. The RFIC includes an antenna including a first antenna patch electrically coupled to the coaxial interconnect. The antenna includes a second antenna patch mounted on the molded layer.

In one embodiment, the first antenna patch is mounted on the redistribution layer. The molded layer is between the first antenna patch and the second antenna patch.

In one embodiment, the first antenna patch is between the redistribution layer and the molded layer.

In one embodiment, the redistribution layer is between the die and the first antenna patch. The redistribution layer includes a lateral trace to carry an electrical signal between the coaxial interconnect and the first antenna patch.

In one embodiment, the die is embedded in the molded layer.

In one embodiment, the coaxial interconnect includes a signal trace extending from the die pad. The coaxial interconnect includes a shield conductor extending from a second die pad on the die face. The shield conductor surrounds the signal trace.

In one embodiment, the molded layer has a layer thickness of at least 100 microns.

In an embodiment, a semiconductor package includes a package substrate. The package substrate includes an antenna including a first antenna patch and a second antenna patch. The package substrate includes a molded layer between the first antenna patch and the second antenna patch. The molded layer includes a molding compound. The package substrate includes a redistribution layer over the molded layer. The redistribution layer includes a coaxial interconnect extending orthogonal to the molded layer and electrically coupled to the first antenna patch. The semiconductor package includes a die mounted on the package substrate. The die includes a die pad electrically coupled to the coaxial interconnect.

In one embodiment, the second antenna patch is mounted on the molded layer over the first antenna patch.

In one embodiment, the first antenna patch is between the redistribution layer and the molded layer.

In one embodiment, the die is embedded in the molded layer.

In one embodiment, the coaxial interconnect extends through the molded layer.

In one embodiment, the redistribution layer includes a lateral trace to carry an electrical signal between the die pad and the first antenna patch.

In one embodiment, the coaxial interconnect includes a signal trace extending from the die pad. The coaxial interconnect includes a shield conductor extending from a second die pad of the die. The shield conductor surrounds the signal trace.

In an embodiment, a method of fabricating a semiconductor package having a die electrically connected to an antenna by a coaxial interconnect includes mounting a die on a carrier substrate. The die includes a die pad on a die face. The method includes forming a redistribution layer over the die pad. The redistribution layer includes a coaxial interconnect. The coaxial interconnect includes a signal trace extending from the die pad orthogonal to the die face. The coaxial interconnect includes a shield conductor surrounding the signal trace. The method includes molding a molded layer over the die. The method includes forming an antenna. The antenna includes a first antenna patch electrically coupled to the coaxial interconnect and a second antenna patch on the molded layer.

In one embodiment, the redistribution layer includes a lateral trace extending parallel to the die face to carry an electrical signal between the die pad and the first antenna patch.

In one embodiment, forming the antenna includes forming the first antenna patch on a first side of the molded layer and forming the second antenna patch on a second side of the molded layer.

In one embodiment, forming the antenna includes forming the first antenna patch on the redistribution layer, and forming the second antenna patch on the molded layer.

In one embodiment, molding the molded layer includes compression molding a molding compound over the die.

In one embodiment, forming the coaxial interconnect includes forming the signal trace on the die pad, and forming the shield conductor on a second die pad on the die face.

The invention claimed is:

1. A radio frequency integrated circuit, comprising:
a die including a die pad on a die face;
a redistribution layer over the die, wherein the redistribution layer includes a coaxial interconnect extending from the die pad orthogonal to the die face, and wherein the die pad is between the die face and the redistribution layer;
a molded layer over the redistribution layer, wherein the molded layer includes a molding compound; and
an antenna including a first antenna patch electrically coupled to the coaxial interconnect, and a second antenna patch mounted on the molded layer.

2. The radio frequency integrated circuit of claim 1, wherein the first antenna patch is mounted on the redistribution layer, and wherein the molded layer is between the first antenna patch and the second antenna patch.

3. The radio frequency integrated circuit of claim 2, wherein the first antenna patch is between the redistribution layer and the molded layer.

4. The radio frequency integrated circuit of claim 2, wherein the redistribution layer is between the die and the first antenna patch, and wherein the redistribution layer includes a lateral trace to carry an electrical signal between the coaxial interconnect and the first antenna patch.

5. The radio frequency integrated circuit of claim 1, wherein the die is embedded in the molded layer.

6. The radio frequency integrated circuit of claim 1, wherein the coaxial interconnect includes a signal trace extending from the die pad, and a shield conductor extending from a second die pad on the die face, wherein the shield conductor surrounds the signal trace.

7. The radio frequency integrated circuit of claim 1, wherein the molded layer has a layer thickness of at least 100 microns.

8. A semiconductor package, comprising:
a package substrate including an antenna including a first antenna patch, and a second antenna patch, a molded layer between the first antenna patch and the second antenna patch, wherein the molded layer includes a molding compound, and a redistribution layer over the molded layer, wherein the redistribution layer includes a coaxial interconnect extending orthogonal to the molded layer and electrically coupled to the first antenna patch; and a die mounted on the package substrate, wherein the die includes a die pad on a die face, the die pad electrically coupled to the coaxial interconnect, and wherein the die pad is between the die face and the redistribution layer.

9. The semiconductor package of claim 8, wherein the second antenna patch is mounted on the molded layer over the first antenna patch.

10. The semiconductor package of claim 9, wherein the first antenna patch is between the redistribution layer and the molded layer.

11. The semiconductor package of claim 8, wherein the die is embedded in the molded layer.

12. The semiconductor package of claim 8, wherein the coaxial interconnect extends through the molded layer.

13. The semiconductor package of claim 8, wherein the redistribution layer includes a lateral trace to carry an electrical signal between the die pad and the first antenna patch.

14. The semiconductor package of claim 8, wherein the coaxial interconnect includes a signal trace extending from the die pad, and a shield conductor extending from a second die pad of the die, and wherein the shield conductor surrounds the signal trace.

15. A method, comprising:
mounting a die on a carrier substrate, wherein the die includes a die pad on a die face;
forming a redistribution layer over the die pad, wherein the die pad is between the die face and the redistribution layer, wherein the redistribution layer includes a coaxial interconnect, wherein the coaxial interconnect includes a signal trace extending from the die pad orthogonal to the die face, and a shield conductor surrounding the signal trace;
molding a molded layer over the die; and
forming an antenna, wherein the antenna includes a first antenna patch electrically coupled to the coaxial interconnect and a second antenna patch on the molded layer.

16. The method of claim 15, wherein the redistribution layer includes a lateral trace extending parallel to the die face to carry an electrical signal between the die pad and the first antenna patch.

17. The method of claim 16, wherein forming the antenna includes forming the first antenna patch on a first side of the molded layer and forming the second antenna patch on a second side of the molded layer.

18. The method of claim 17, wherein forming the antenna includes forming the first antenna patch on the redistribution layer, and forming the second antenna patch on the molded layer.

19. The method of claim 15, wherein molding the molded layer includes compression molding a molding compound over the die.

20. The method of claim 15, wherein forming the coaxial interconnect includes forming the signal trace on the die pad, and forming the shield conductor on a second die pad on the die face.

* * * * *